United States Patent
Yoshihara et al.

(10) Patent No.: US 8,638,616 B2
(45) Date of Patent: Jan. 28, 2014

(54) NONVOLATILE STORAGE DEVICE HAVING A PLURALITY OF PLATE ELECTRODES

(75) Inventors: Hiroshi Yoshihara, Nagasaki (JP); Takayuki Arima, Nagasaki (JP); Takeshi Etou, Nagasaki (JP)

(73) Assignee: Sony Corporation, Tokyo (JP)

( * ) Notice: Subject to any disclaimer, the term of this patent is extended or adjusted under 35 U.S.C. 154(b) by 312 days.

(21) Appl. No.: 12/929,360

(22) Filed: Jan. 19, 2011

(65) Prior Publication Data
US 2011/0235393 A1  Sep. 29, 2011

(30) Foreign Application Priority Data
Mar. 26, 2010 (JP) ................................. 2010-073368

(51) Int. Cl.
*G11C 5/14* (2006.01)

(52) U.S. Cl.
USPC ............ 365/189.09; 365/189.11; 365/230.06; 365/148

(58) Field of Classification Search
USPC ............ 365/148, 158, 161, 171, 163, 230.03, 365/173, 145
See application file for complete search history.

(56) References Cited

U.S. PATENT DOCUMENTS

| | | | | |
|---|---|---|---|---|
| 5,424,976 A * | 6/1995 | Cuppens | ........................ | 365/145 |
| 5,600,587 A * | 2/1997 | Koike | ........................... | 365/145 |
| 6,101,119 A * | 8/2000 | Yi et al. | ........................ | 365/149 |
| 6,288,931 B1 * | 9/2001 | Kye et al. | ....................... | 365/145 |
| 6,667,896 B2 * | 12/2003 | Rickes et al. | .................. | 365/145 |
| 6,700,811 B1 * | 3/2004 | Weng et al. | .................... | 365/145 |
| 7,106,616 B2 * | 9/2006 | Takahashi | ....................... | 365/145 |
| 7,359,230 B2 * | 4/2008 | Sumida et al. | ................. | 365/148 |
| 7,835,169 B2 * | 11/2010 | Murakuki et al. | ............. | 365/145 |
| 8,144,499 B2 * | 3/2012 | Kitagawa et al. | ............. | 365/148 |
| 8,331,172 B2 * | 12/2012 | Takahashi | ................. | 365/189.18 |
| 2005/0013156 A1 * | 1/2005 | Hoya et al. | ..................... | 365/145 |
| 2006/0028857 A1 * | 2/2006 | Sueoka | ........................... | 365/149 |
| 2009/0010038 A1 * | 1/2009 | Madan et al. | ................. | 365/145 |

FOREIGN PATENT DOCUMENTS

JP    2006-351779    12/2006

* cited by examiner

*Primary Examiner* — Kretelia Graham
(74) *Attorney, Agent, or Firm* — Rader, Fishman & Grauer PLLC

(57) ABSTRACT

A nonvolatile storage device includes: a plurality of memory mats each including a plurality of memory cells; a plurality of plate electrodes each provided for every individual one of the memory mats and each used for applying a voltage to the memory cells; a power-supply section configured to apply a voltage to each of the plate electrodes; a switch circuit having a plurality of switches provided between the power-supply section and each of the plate electrodes and between the plate electrodes; and a control section configured to control the switch circuit in order to disconnect the plate electrodes from the power-supply section and to connect the plate electrodes to each other in order to carry out electrical charging and discharging operations among the plate electrodes.

12 Claims, 4 Drawing Sheets

NONVOLATILE STORAGE DEVICE HAVING A PLURALITY OF PLATE ELECTRODES

BACKGROUND OF THE INVENTION

1. Field of the Invention

In general, the present invention relates to a nonvolatile storage device. To put it in detail, the present invention relates to a nonvolatile storage device having a plurality of plate electrodes each used for applying a voltage to a plurality of memory cells.

2. Description of the Related Art

Most of information apparatus such as a computer make use of a high-density DRAM (Dynamic Random Access Memory) as a storage device which is capable of operating at a high speed. Since the DRAM is a volatile storage device which inevitably loses information stored therein when the power supply thereof is turned off, however, there is a demand for a nonvolatile storage device which does not undesirably lose information stored therein even if the power supply thereof is turned off.

In order to meet the demand described above, there has been proposed a variable-resistance-type storage device to be used as the nonvolatile storage device. Typical examples of the variable-resistance-type storage device are an FeRAM (Ferroelectric Random Access Memory), an MRAM (Magnetic Random Access Memory), a PMC (Programmable Metallization Cell) and an RRAM (Resistive Random Access Memory). Each of these nonvolatile storage devices is capable of continuously holding information stored therein for long time even if the supply of power to the nonvolatile storage device is cut off. In addition, each of these nonvolatile storage devices does not require a refresh operation so that the amount of power supplied to the storage device can be reduced by a quantity which is needed to carry out the refresh operations.

Such nonvolatile storage devices include one that adopts a plate method. In the nonvolatile storage device which adopts the plate method, a storage element employed in each memory cell included in the nonvolatile storage device is electrically connected to a common plate electrode for applying a common voltage to the storage elements. The plate electrode provides a storage element with a voltage for writing data into a memory cell employing the storage element or a voltage for erasing data from a memory cell employing the storage element. For more information on this nonvolatile storage device which adopts the plate method, the reader is advised to refer to Japanese Patent Laid-open No. 2006-351779.

SUMMARY OF THE INVENTION

The nonvolatile storage device adopting the plate method as described above has a merit that the process of manufacturing the nonvolatile storage device is simple. On the other hand, the nonvolatile storage device adopting the plate method as described above has a demerit that the circuit of the plate electrode needs to make a transition from a voltage for writing data into a memory cell employing the storage element to a voltage for erasing data from a memory cell employing the storage element and vice versa. Thus, the power consumption raises a problem. In particular, if the memory capacity of the nonvolatile storage device is increased, the area of the plate electrode also undesirably rises so that the amount of power consumed during operations to electrically charge and discharge the plate electrode further increases unavoidably.

Addressing the problems described above, inventors of the present invention have provided a plate-method nonvolatile storage device capable of reducing the power consumption.

In order to solve the problems described above, according to an embodiment of the present invention, there is provided a nonvolatile storage device which employs:

a plurality of memory mats each including a plurality of memory cells;

a plurality of plate electrodes each provided for every individual one of the memory mats and each used for applying a voltage to the memory cells;

a power-supply section configured to apply a voltage to each of the plate electrodes;

a switch circuit having a plurality of switches provided between the power-supply section and each of the plate electrodes and between the plate electrodes; and a control section configured to control the switch circuit in order to disconnect the plate electrodes from the power-supply section and to connect the plate electrodes to each other in order to carry out electrical charging and discharging operations among the plate electrodes.

In addition, in the nonvolatile storage device according to the embodiment of the present invention, the control section controls the switch circuit in order to connect a specific one of the plate electrodes to another one of the plate electrodes so as to transfer electric charge accumulated in the specific plate electrode to the other plate electrode and in order to connect the specific plate electrode to the other plate electrode later on so as to transfer electric charge accumulated in the other plate electrode to the specific plate electrode.

On top of that, in the nonvolatile storage device according to the embodiment of the present invention, the control section controls the switch circuit in order to connect a specific one of the plate electrodes to a plurality of other ones of the plate electrodes in an order determined in advance so as to transfer electric charge accumulated in the specific plate electrode to the other plate electrodes and in order to connect the specific plate electrode to the other plate electrodes on in a reverse order opposite to the order determined in advance so as to transfer electric charge accumulated in the other plate electrodes to the specific plate electrode.

In addition, in the nonvolatile storage device according to the embodiment of the present invention, each individual one of the memory cells employs a variable-resistance-type storage element and an access transistor connected to one of the two terminals of the variable-resistance-type storage element. The other terminal of the variable-resistance-type storage element is connected to the plate electrode.

According to the present invention, in the plate-method nonvolatile storage device, electric charge accumulated in a plate electrode is reutilized so that the magnitude of a consumed current can be reduced. In particular, by increasing the number of memory mats each provided with a plate electrode, the effect of the reduced magnitude of the consumed power is big.

DETAILED DESCRIPTION OF THE PREFERRED EMBODIMENT

An embodiment implementing the present invention is described below. It is to be noted that the embodiment is explained in chapters which are arranged as follows.

1: Outline of Characteristics of a Nonvolatile Storage Device

2: Concrete Configuration of the Nonvolatile Storage Device

3: Voltage Control of the Plate Electrode

1: Outline of Characteristics of a Nonvolatile Storage Device

A nonvolatile storage device according to an embodiment employs a plurality of memory mats each having a plurality of memory cells. Each of the memory mats is provided with a plate electrode. The plate electrode applies a voltage to the memory cells employed in a memory mat which is provided with the plate electrode. The voltage is generated by a power-supply section employed in the nonvolatile storage device.

Figure 4:
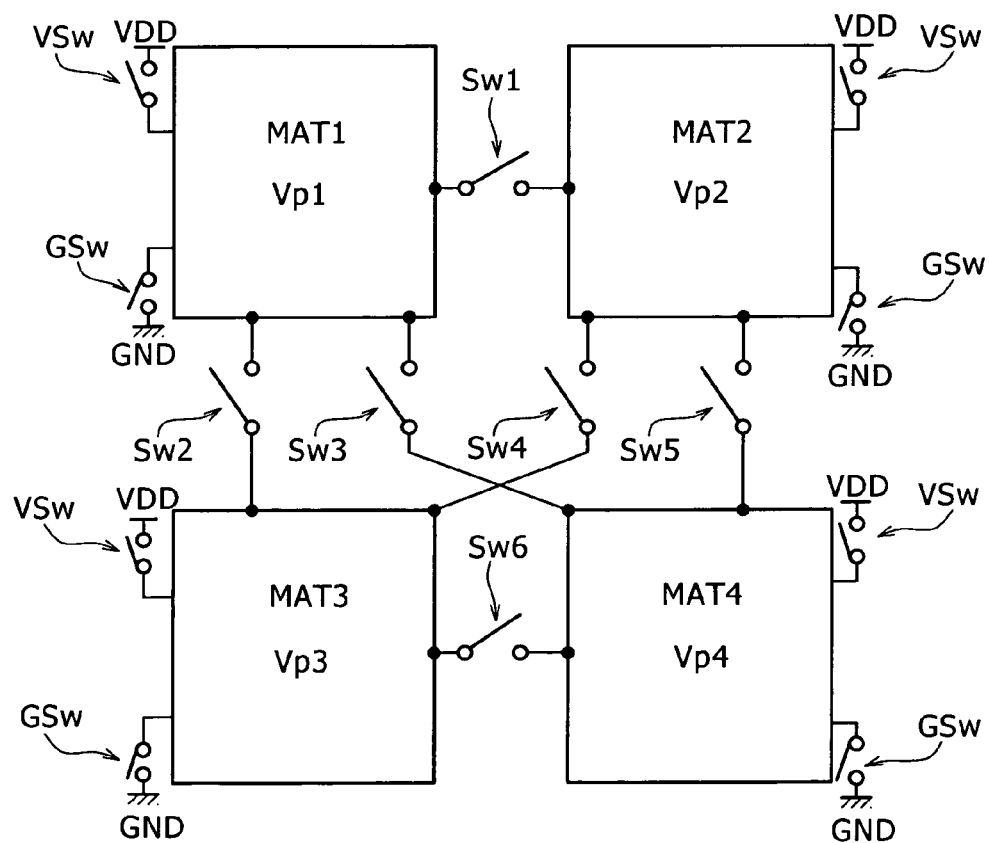
FIG. 4 is an explanatory block diagram to be referred to in description of a switch circuit employed in the nonvolatile storage device.

In addition, power-supply switches are provided between the power-supply section and each of the plate electrodes. To put it more concretely, as shown in FIG. 4, a ground switch GSw is provided between the ground node of the power-supply section and each individual one of the plate electrodes whereas a power-supply switch VSw is provided between the power-supply node of the power-supply section and the individual plate electrode. The ground node of the power-supply section is a node at which the ground voltage GND appears whereas the power-supply node of the power-supply section is a node at which the power-supply voltage VDD appears. A control section controls these power-supply switches in order to selectively connect the ground node of the power-supply section to the plate electrode so as to apply the ground voltage GND to the plate electrode or in order to selectively connect the power-supply node of the power-supply section to the plate electrode so as to apply the power-supply voltage VDD to the plate electrode.

On top of that, there are also provided a plurality of charge-transfer switches each used for connecting any two of the plate electrodes to each other. The control section controls any individual one of these charge-transfer switches in order to let electrical charging and discharging operations take place between the plate electrodes which are connected to each other by the individual charge-transfer switch. As a result, the power consumption can be reduced.

For example, in an operation to write data into a memory cell, let the power-supply section supply the power-supply voltage VDD to a plate electrode provided for a memory mat which employs the memory cell. It is to be noted that, in the following description, this plate electrode is referred to as a first plate electrode. Later on, assume that it is necessary to supply the ground voltage GND to the first plate electrode in order to erase the data from the memory cell. In this case, with the related-art technology adopted, the ground voltage GND is supplied right away to the first plate electrode in order to transfer electric charge accumulated in the first plate electrode to the ground node which is also referred to hereafter simply as the ground. As a result, the first plate electrode is set at the ground voltage GND. In the case of the nonvolatile storage device according to the embodiment, on the other hand, instead of supplying the ground voltage GND right away to the first plate electrode, the first plate electrode is connected to another plate electrode referred to hereafter as a second plate electrode in order to temporarily transfer electric charge accumulated in the first plate electrode to the second plate electrode in advance. Later on, the first plate electrode is connected to the ground node in order to set a voltage appearing on the first plate electrode at the ground voltage GND so as to erase the data from the memory cell. Then, the electric charge temporarily accumulated in the second plate electrode is further transferred to a low-voltage further plate electrode referred to hereafter as a third plate electrode which needs to be set at the power-supply voltage VDD in order to write data into the third plate electrode.

For example, the third plate electrode is the first plate electrode itself. As described above, the first plate electrode has been connected to the ground node in order to set a voltage appearing on the first plate electrode at the ground voltage GND. In this case, electric charge is transferred from the second plate electrode back to the first plate electrode. Later on, the first plate electrode is connected to the power-supply node of the power-supply section in order to set a voltage appearing on the first plate electrode at the power-supply voltage VDD so as to write data into the memory cell.

As described above, in the nonvolatile storage device according to the embodiment, before a voltage appearing on a plate electrode is changed from the power-supply voltage VDD to the ground voltage GND, electric charge accumulated in the plate electrode is transferred to another plate electrode in advance. Before a voltage appearing on a plate electrode is changed from the ground voltage GND to the power-supply voltage VDD, on the other hand, electric charge accumulated in another plate electrode is transferred to the plate electrode in advance. In this way, it is possible to reutilize electric charge which used to be electrically discharged to the ground node in accordance with the related-art technology. As a result, the power consumption can be reduced.

Figure 1:
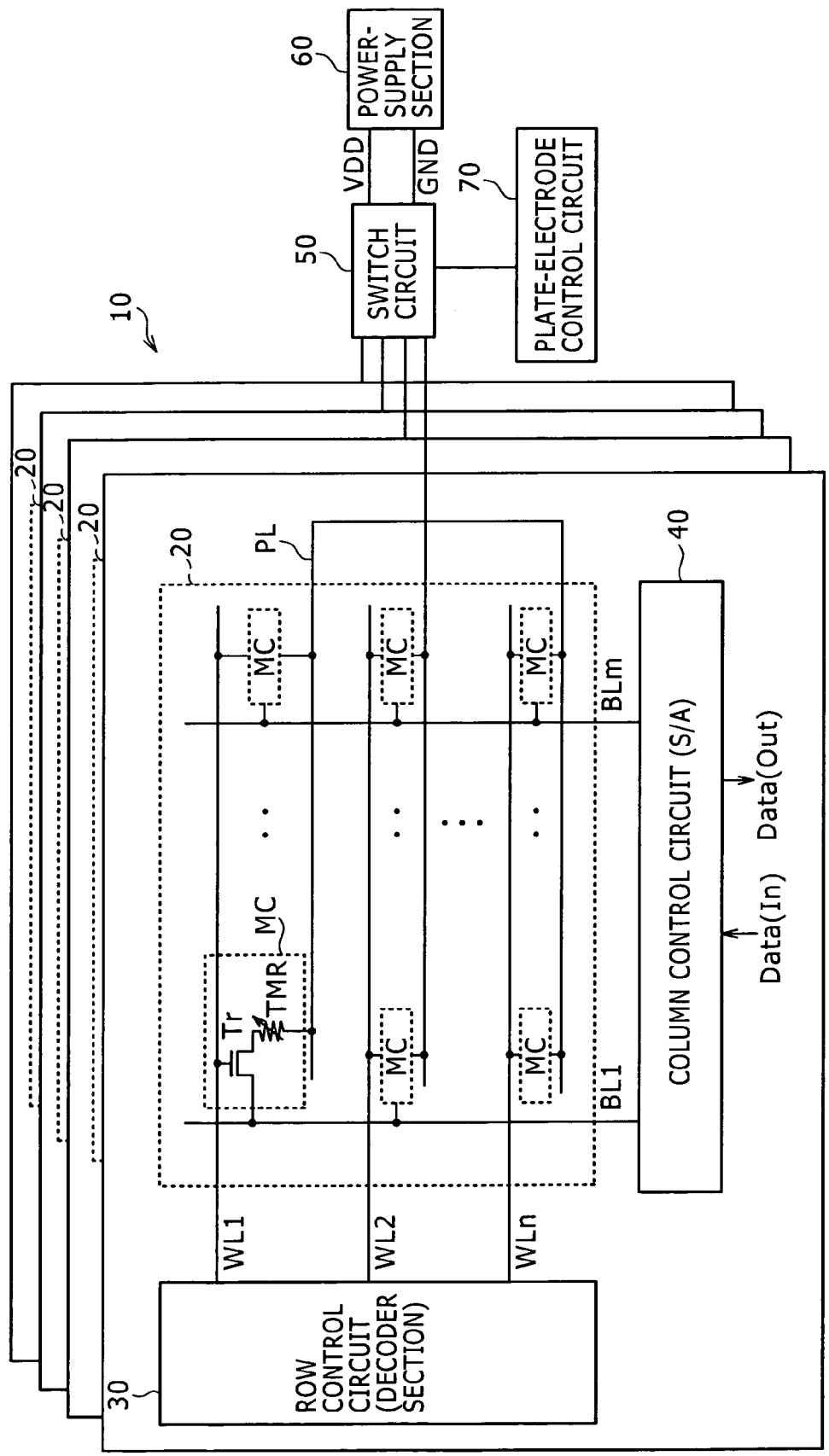
FIG. 1 is an explanatory block diagram showing an outline of a nonvolatile storage device according to an embodiment of the present invention.

As shown in FIG. 1, each of the memory cells MC employs a variable-resistance-type storage element TMR and an access transistor Tr connected to one of the two terminals of the variable-resistance-type storage element TMR. To put it in detail, the drain of the access transistor Tr is connected to a bit line BL whereas the gate of the access transistor Tr is connected to a word line WL. On the other hand, the source of the access transistor Tr is connected to one of the two terminals of the variable-resistance-type storage element TMR whereas the other terminal of the variable-resistance-type storage element TMR is connected to the plate electrode PL. By controlling voltages appearing on the bit line BL, the word line WL and the plate electrode PL, the resistance of the variable-resistance-type storage element TMR employed in the memory cell MC can be changed to a large or small value. The operation described earlier as an operation to write data into the memory cell MC is carried out by changing the resistance of the variable-resistance-type storage element TMR from a large value to a small value. This operation is referred to as a set operation. On the other hand, the operation described before as an operation to erase data from the memory cell MC is carried out by changing the resistance of the variable-resistance-type storage element TMR from a small value to a large value. This operation is referred to as a reset operation. In addition, an operation to read out the resistance of the variable-resistance-type storage element TMR can be carried out in order to verify whether or not a preceding set or reset operation has been performed normally. This operation is referred to as a verify operation.

It is to be noted that, as an alternative, the operation described earlier as an operation to write data into the memory cell MC is carried out conversely by changing the resistance of the variable-resistance-type storage element TMR from a small value to a large value. On the other hand, the operation described before as an operation to erase data from the memory cell MC is carried out by changing the resistance of the variable-resistance-type storage element TMR from a large value to a small value. That is to say, in this case, the operation to write data into the memory cell MC is carried out by performing a reset operation whereas the operation to erase data from the memory cell MC is carried out by performing a set operation.

Next, the concrete configuration of the nonvolatile storage device 10 according to the embodiment is described concretely below by referring to diagrams. The following description also concretely explains concrete operations carried out by the nonvolatile storage device 10.

2: Concrete Configuration of the Nonvolatile Storage Device

First of all, a typical concrete configuration of the nonvolatile storage device 10 according to the embodiment is described by referring to FIG. 1 as follows.

As shown in FIG. 1, the nonvolatile storage device 10 has a plurality of memory mats 20 which are each also referred to as a unit cell array. In each of the memory mats 20, the set, reset or verify operation described above is carried out in accordance with control executed by a control circuit which employs a column control circuit 40, a row control circuit 30 and a plate-electrode control circuit 70.

Each of the memory mats 20 has a plurality of memory cells CM which are laid out to form a matrix. Each of the memory cells MC employs a variable-resistance-type storage element TMR and an access transistor Tr connected to one of the two terminals of the variable-resistance-type storage element TMR. To put it in detail, the drain of the access transistor Tr is connected to a bit line BL whereas the gate of the access transistor Tr is connected to a word line WL. On the other hand, the source of the access transistor Tr is connected to one of the two terminals of the variable-resistance-type storage element TMR whereas the other terminal of the variable-resistance-type storage element TMR is connected to the plate electrode PL. By controlling voltages appearing on the bit line BL, the word line WL and the plate electrode PL, the set, reset or verify operation described above is carried out.

The column control circuit 40 controls a voltage appearing on every individual one of the bit lines BL so as to carry out a set or reset operation for changing the resistance of the variable-resistance-type storage element TMR employed in each of memory cells MC connected to the individual bit line BL to a small or large value respectively. In addition, the column control circuit 40 also controls a voltage appearing on every individual one of the bit lines BL so as to carry out a verify operation for reading out the resistance of the variable-resistance-type storage element TMR after a set or reset operation carried out prior to the verify operation in order to verify that the set or reset operation carried out prior to the verify operation has been normally completed.

On the other hand, the row control circuit 30 controls a voltage appearing on every individual one of the word lines WL each connected to the gate of the access transistor Tr employed in each of memory cells MC which are laid out on a row corresponding to the individual word line WL to serve as memory cells MC each carrying out a set, reset or verify operation.

The plate electrodes PL each wired to a memory mat 20 are connected to a switch circuit 50. The switch circuit 50 employs power-supply switches each connecting a power-supply section 60 to one of the plate electrodes PL, ground switches each connecting a ground node to one of the plate electrodes PL and charge-transfer switches each connecting two plate electrodes PL to each other. The switch circuit 50 is controlled by the plate-electrode control circuit 70. That is to say, the plate-electrode control circuit 70 puts each of the power-supply switches and the ground switches in a turned-on or turned-off state in order to control a voltage appearing on every plate electrode PL which is connected to a memory mat 20. In addition, the plate-electrode control circuit 70 also controls the charge-transfer switches each connecting two plate electrodes PL of two memory mats 20 respectively to each other by putting each of the charge-transfer switches in a turned-on or turned-off state in order to carry out electrical charging and discharging operations between the two plate electrodes PL so as to reduce the power consumption of the nonvolatile storage device 10.

As described above, every memory mat 20 employs a plurality of memory cells MC which are connected to a plurality of bit lines BL, a plurality of word lines WL and a plate electrode PL. The following description explains the set, reset and verify operations which are carried out by controlling voltages appearing on the bit lines BL, the word lines WL and the plate electrode PL. The set, reset and verify operations are described in detail by referring to FIG. 2.

Figure 2:
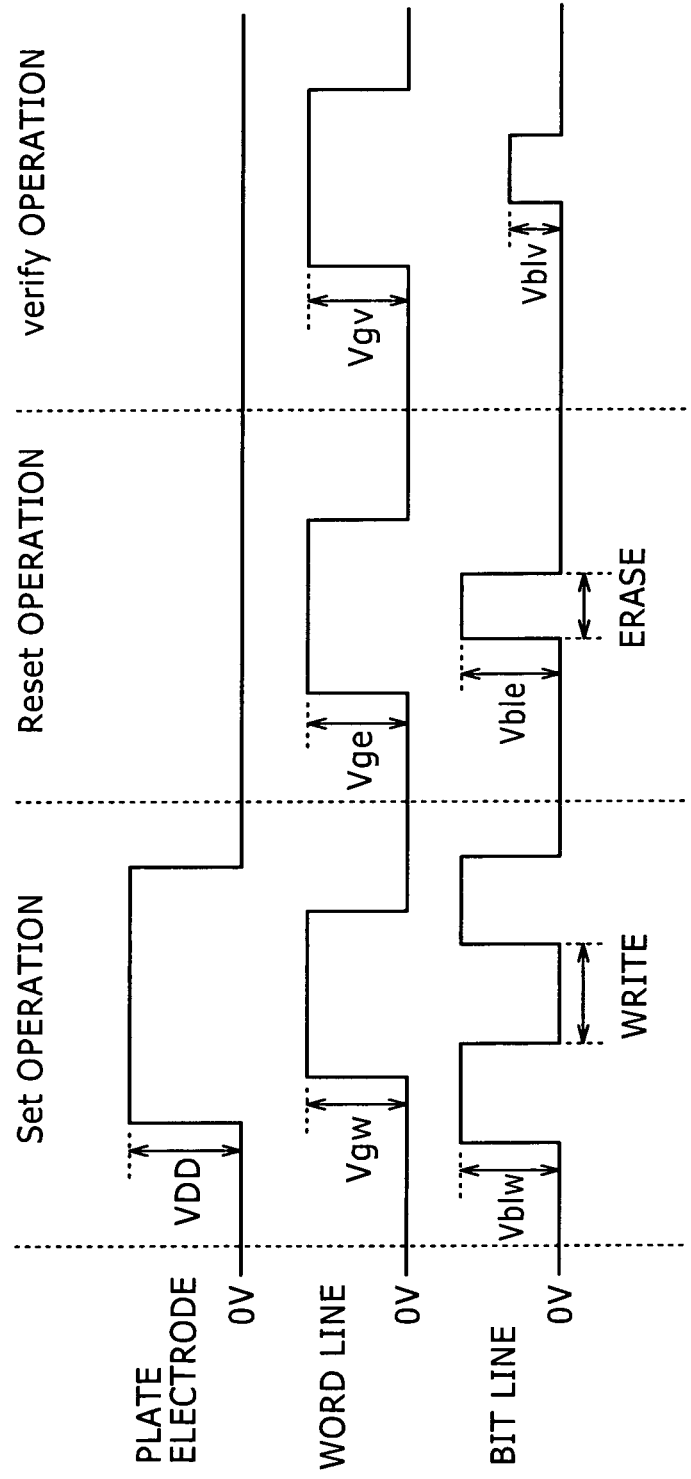
FIG. 2 is an explanatory block diagram to be referred to in description of basic operations carried out by the nonvolatile storage device.

As shown in FIG. 2, in the set operation, first of all, a voltage appearing on a plate electrode PL connected to a memory mat 20 employing a memory cell MC serving as a subject of the set operation is set at the power-supply voltage VDD. In the following description, the memory cell MC serving as a subject of the set operation is referred to simply as a set-subject cell for the sake of simplicity. Then, a voltage appearing on a bit line BL connected to the set-subject cell is set at a level Vblw. Subsequently, a voltage appearing on a word line WL connected to the set-subject cell is set at a level Vgw in order to select the set-subject cell. Then, the voltage appearing on the bit line BL connected to the set-subject cell is set at the ground voltage GND in order to let a current flow from the plate electrode PL to the bit line BL through the set-subject cell which includes a variable-resistance-type storage element TMR. Thus, the resistance of the variable-resistance-type storage element TMR employed in the set-subject cell is changed from a large value to a small value. Subsequently, the voltage appearing on the bit line BL connected to the set-subject cell is again set at the level Vblw. Then, the voltages appearing on the word line WL, the plate electrode PL and the bit line BL are set at the ground voltage GND sequentially in order to terminate the set operation. Even after the voltages appearing on the word line WL, the plate electrode PL and the bit line BL have been set at the ground voltage GND sequentially, the resistance of the variable-resistance-type storage element TMR is sustained in the state of being set at the small value as it is.

As shown in FIG. 2, in the reset operation, a voltage appearing on a plate electrode PL connected to a memory mat 20 employing a memory cell MC serving as a subject of the reset operation is set and sustained at the ground voltage GND. In the following description, the memory cell MC serving as a subject of the reset operation is referred to simply as a reset-subject cell for the sake of simplicity. In addition, a voltage appearing on a bit line BL connected to the reset-subject cell is also set at the ground voltage GND. In this state, a voltage appearing on a word line WL connected to the reset-subject cell is set at a level Vge in order to select the reset-subject cell.

Then, the voltage appearing on the bit line BL connected to the reset-subject cell is set at a level Vble in order to let a current flow from the bit line BL to the plate electrode PL through the reset-subject cell which includes a variable-resistance-type storage element TMR. Thus, the resistance of the variable-resistance-type storage element TMR employed in the reset-subject cell is changed from a small value to a large value. Subsequently, the voltage appearing on the bit line BL connected to the reset-subject cell is again set at the ground voltage GND. Then, the voltage appearing on the word line WL is also set at the ground voltage GND in order to terminate the reset operation. Even after the voltages appearing on the word line WL and the bit line BL have been set at the ground voltage GND sequentially, the resistance of the variable-resistance-type storage element TMR is sustained in the state of being set at the large value as it is.

As shown in FIG. 2, in the verify operation, a voltage appearing on a plate electrode PL connected to a memory mat 20 employing a memory cell MC serving as a subject of the verify operation is set and sustained at the ground voltage GND. In the following description, the memory cell MC serving as a subject of the verify operation is referred to simply as a verify-subject cell for the sake of simplicity. In addition, a voltage appearing on a bit line BL connected to the verify-subject cell is also set at the ground voltage GND. In this state, a voltage appearing on a word line WL connected to the verify-subject cell is set at a level Vgv in order to select the verify-subject cell. Then, the voltage appearing on the bit line BL connected to the verify-subject cell is set at a level Vblv in order to let a data read current flow from the bit line BL to the plate electrode PL through the verify-subject cell, which includes a variable-resistance-type storage element TMR, in a data read operation to read out data held in the variable-resistance-type storage element TMR. Subsequently, the voltage appearing on the bit line BL connected to the verify-subject cell is again set at the ground voltage GND. Then, the voltage appearing on the word line WL is also set at the ground voltage GND.

A verify operation is carried out after a set or reset operation in order to verify that the preceding set or reset operation has been completed normally. To put it more concretely, in a verify operation carried out after a set operation, the data read out from the variable-resistance-type storage element TMR is examined in order to determine whether or not the resistance of the variable-resistance-type storage element TMR has indeed a small value. In a verify operation carried out after a reset operation, on the other hand, the data read out from the variable-resistance-type storage element TMR is examined in order to determine whether or not the resistance of the variable-resistance-type storage element TMR has indeed a large value.

As is obvious from the above explanations of the basic operations, it is necessary to set the voltage appearing on the plate electrode PL at the power-supply voltage VDD in the set operation. In the reset and verify operations, on the other hand, it is necessary to set the voltage appearing on the plate electrode PL at the ground voltage GND. Thus, in a transition from the set operation to the reset operation or in a transition from the set operation to the verify operation, electric charge accumulated in the plate electrode PL is electrically discharged to the ground node.

In order to reduce the amount of power consumed in a transition from the set operation to the reset operation or in a transition from the set operation to the verify operation, in the nonvolatile storage device 10 according to the embodiment, electrical charging and electrical discharging operations are carried out among a plurality of plate electrodes PL each connected to one of the memory mats 20 so as to reutilize electric charge accumulated in the plate electrodes PL. In this way, the power consumption of the nonvolatile storage device 10 can be reduced.

3: Voltage Control of the Plate Electrode PL

Next, the following description explains an operation carried out to control a voltage appearing on the plate electrode PL in order to reduce the power consumption. To put it more concretely, the following description explains a case in which electric power is reutilized in the nonvolatile storage device 10 which employs four memory mats 20. In addition, it is also assumed that, a set operation is carried out as a data write operation on a specific one of the memory mats 20. Thus, in order to carry out the data write operation on only the specific memory mat 20, the set and verify operations are carried out as the basic operations described earlier on the specific memory mat 20 repeatedly a predetermined number of times till the data write operation carried out as the set operations is completed. For example, the set and verify operations are carried out repeatedly four times. In the set and verify operations carried out repeatedly four times, electrical charging and discharging operations are carried out repeatedly between the plate electrode PL connected to the specific memory mat 20 and the plate electrodes PL which are each connected to one of the three remaining memory cells 20. In addition, electric charge electrically discharged from the plate electrode PL connected to the specific memory mat 20 is accumulated as electric charge for an electrical charging operation in each of the plate electrodes PL which are each connected to one of the three remaining memory cells 20.

Figure 3:
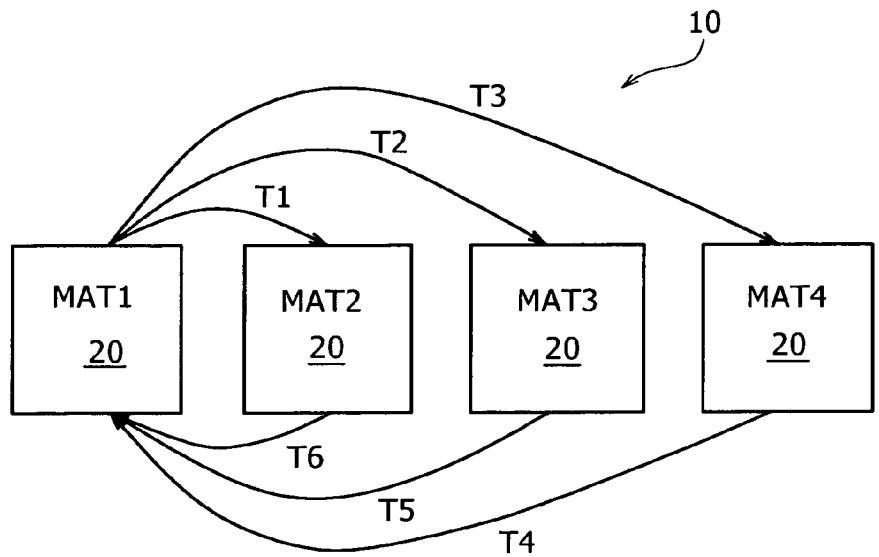
FIG. 3 is an explanatory block diagram to be referred to in description of an outline of reutilization of electric charge among memory mats employed in the nonvolatile storage device.
Figure 5:
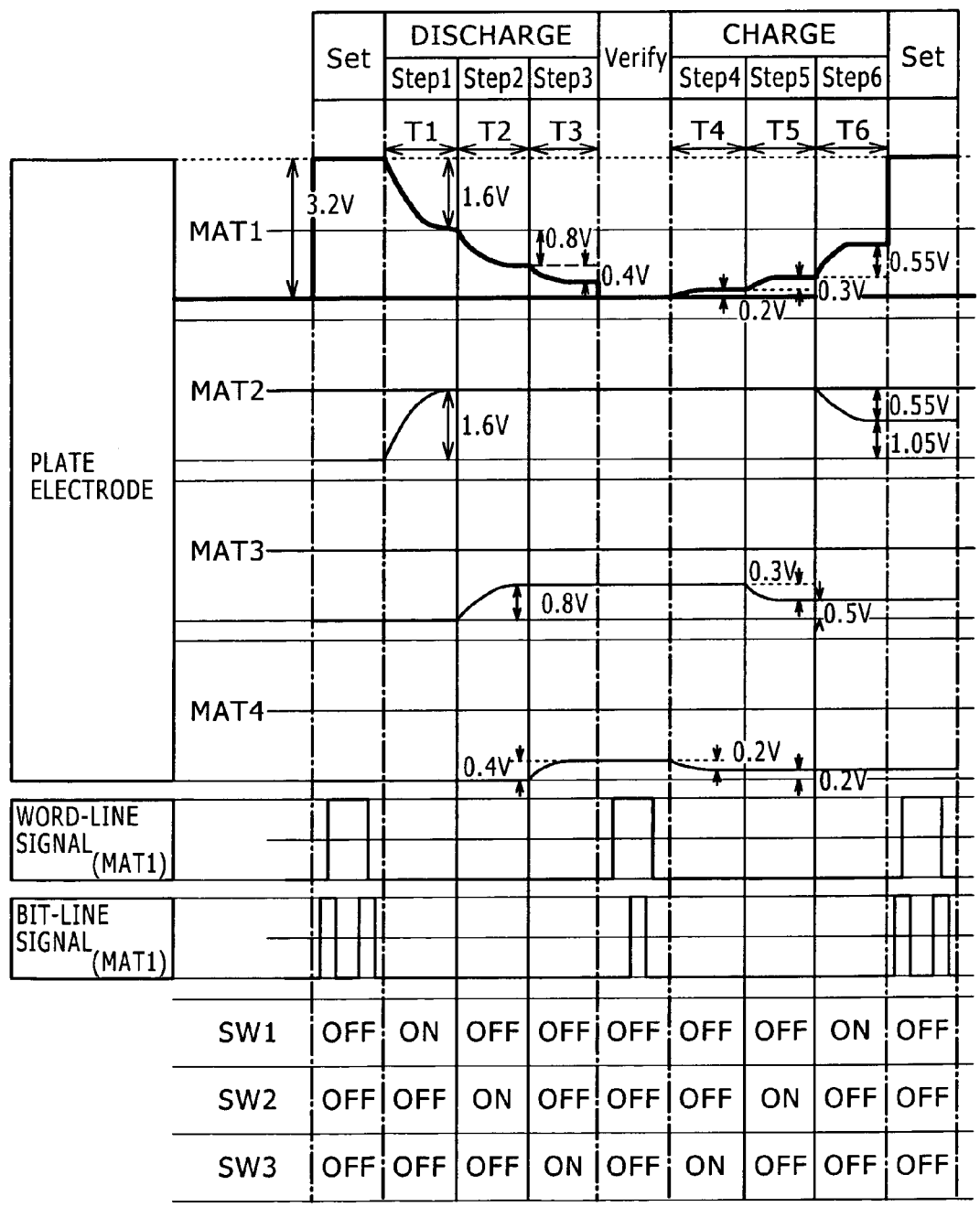
FIG. 5 is an explanatory block diagram to be referred to in description of details of reutilization of electric charge among memory mats employed in the nonvolatile storage device.

FIG. 3 is an explanatory block diagram referred to in the following description of an outline procedure for transferring electric charge among the four memory mats 20 which are employed in the nonvolatile storage device 10. FIG. 4 is an explanatory block diagram referred to in the following description of the configuration of the switch circuit 50 employed in the nonvolatile storage device 10 to serve as a switch circuit for implementing the transfers of electric charge among the four memory mats 20. FIG. 5 is an explanatory diagram showing the timings of the transfers of electric charge among the four memory mats 20 and the amount of electric charge transferred in each of the transitions. For the sake of convenience, in the following description, the four memory mats 20 employed in the nonvolatile storage device 10 are given names MAT1, MAT2, MAT3 and MAT4 respectively.

As shown in FIG. 3, the nonvolatile storage device 10 composed of the four memory mats 20 transfers electric charge from the plate electrode PL of MAT1 to the plate electrodes PL connected to the other memory mats 20, i.e., MAT2 to MAT4, and accumulates the transferred electric charge in the plate electrodes PL of MAT2 to MAT4 in advance in accordance with the following procedure. After the set operation carried out on MAT1 has been terminated, prior to the start of the verify operation, a sequence of three electrical discharging operations is carried out in order to transfer electric charge accumulated in the plate electrode PL of MAT1 to the plate electrodes PL of MAT2 to MAT4 respectively. It is to be noted that, while the sequence of three electrical discharging operation is being carried out, the plate electrodes PL of MAT1 to MAT4 are not connected to the power-supply node and the ground node.

Times t1 to t3 shown in FIG. 3 indicate the time-axis order of the executions of the three electrical discharging operations to transfer electrical charge from the plate electrode PL of MAT1 to the plate electrodes PL of MAT2 to MAT4 respectively and hold the electrical charge in the plate electrodes PL of MAT2 to MAT4. To put it in detail, first of all, at the time t1, a charge-transfer switch connecting the plate electrode PL of MAT1 to the plate electrode PL of MAT2 is turned on and sustained in the turned-on state for a predetermined period of time. Thus, in the predetermined period of time, electrical charge accumulated so far in the plate electrode PL of MAT1 is transferred to the plate electrode PL of MAT2. Then, at the time t2, a charge-transfer switch connecting the plate electrode PL of MAT1 to the plate electrode PL of MAT3 is turned on and sustained in the turned-on state for a predetermined period of time. Thus, in the predetermined period of time, electrical charge accumulated so far in the plate electrode PL of MAT1 is transferred to the plate electrode PL of MAT3. Finally, at the time t3, a charge-transfer switch connecting the plate electrode PL of MAT1 to the plate electrode PL of MAT4 is turned on and sustained in the turned-on state for a predetermined period of time. Thus, in the predetermined period of time, electrical charge accumulated so far in the plate electrode PL of MAT1 is transferred to the plate electrode PL of MAT4.

As described above, electrical charge is electrically discharged from the plate electrode PL of MAT1 to the plate electrodes PL of MAT2 to MAT4 and accumulated in advance in the plate electrodes PL of MAT2 to MAT4 to be used in the next set operation carried out on MAT1. Then, a ground switch connecting the plate electrode PL of MAT1 to the ground node is put it in a turned-on state in order to electrically discharge electrical charge left in the plate electrode PL of MAT1 to the ground node so as to set a voltage appearing on the plate electrode PL of MAT1 at the ground voltage GND of 0 V.

Then, after the verify operation carried out on MAT1 to follow the three electrical discharging operations described above has been terminated, prior to the start of the next set operation to be carried out on MAT1, a sequence of three electrical charging operations is carried out in order to transfer the electric charge accumulated in each of the plate electrodes PL of MAT2 to MAT4 during respectively the three electrical discharging operations described above back to the plate electrode PL of MAT1.

Times t4 to t6 shown in FIG. 3 indicate the time-axis order of the executions of the three electrical charging operations to transfer electrical charge from the plate electrodes PL of MAT4, MAT3 and MAT2 respectively to the plate electrode PL of MAT1. The electrical charge has been transferred from the plate electrode PL of MAT1 to the plate electrodes PL of MAT2 to MAT4 and held in the plate electrodes PL of MAT2 to MAT4 in the previous electrical discharging operations described above. To put it in detail, first of all, at the time t4, a charge-transfer switch connecting the plate electrode PL of MAT4 to the plate electrode PL of MAT1 is turned on and sustained in the turned-on state for a predetermined period of time. Thus, in the predetermined period of time, electrical charge accumulated so far in the plate electrode PL of MAT4 is transferred back to the plate electrode PL of MAT1. Then, at the time t5, a charge-transfer switch connecting the plate electrode PL of MAT3 to the plate electrode PL of MAT1 is turned on and sustained in the turned-on state for a predetermined period of time. Thus, in the predetermined period of time, electrical charge accumulated so far in the plate electrode PL of MAT3 is transferred back to the plate electrode PL of MAT1. Finally, at the time t6, a charge-transfer switch connecting the plate electrode PL of MAT2 to the plate electrode PL of MAT1 is turned on and sustained in the turned-on state for a predetermined period of time. Thus, in the predetermined period of time, electrical charge accumulated so far in the plate electrode PL of MAT2 is transferred back to the plate electrode PL of MAT1.

After the three electrical charging operations to transfer electrical charge from the plate electrodes PL of MAT2 to MAT4 back to the plate electrode PL of MAT1 have been terminated, a power-supply switch connecting the plate electrode PL of MAT1 to the power-supply section 60 is put in a turned-on state in order to transfer additional electrical charge required in the next set operation from the power-supply section 60 to the plate electrode PL of MAT1. In this way, the next set operation is carried out by transferring the additional electrical charge required in the next set operation from the power-supply section 60 to the plate electrode PL of MAT1.

It is to be noted that, in the three electrical charging operations to transfer electrical charge from the plate electrodes PL of MAT2 to MAT4 back to the plate electrode PL of MAT1, the electrical charge accumulated so far in the plate electrodes PL of MAT2 to MAT4 is not necessarily all transferred back to the plate electrode PL of MAT1. Instead, the electrical charging operations to transfer electrical charge from the plate electrodes PL of MAT2 to MAT4 back to the plate electrode PL of MAT1 are terminated as electric charge accumulated in the plate electrode PL of MAT1 enters the state of an equilibrium with electric charge accumulated in each of the plate electrodes PL of MAT2 to MAT4, putting a voltage appearing on the plate electrode PL of MAT1 in a settled state. In the state of an equilibrium between two plate electrodes PL, a voltage appearing on one of the plate electrode PL is equal to a voltage which is appearing on the other plate electrode PL. That is to say, after the electrical charging operations to transfer electrical charge from the plate electrodes PL of MAT2 to MAT4 back to the plate electrode PL of MAT1 have been terminated, electric charge is still left in each of the plate electrodes PL of MAT2 to MAT4.

Thus, by repeatedly carrying out the electrical discharging operations to transfer electrical charge from the plate electrode PL of MAT1 to the plate electrodes PL of MAT2 to MAT4 at the times t1 to t3 respectively and the electrical charging operations to transfer electrical charge from the plate electrodes PL of MAT2, MAT3 and MAT4 back to the plate electrode PL of MAT1 at the times t6, t5 and t4 respectively, the amount of electric charge accumulated in each of the plate electrodes PL of MAT2 to MAT4 gradually rises. As a result, the amount of electric charge that can be transferred from each of the plate electrodes PL of MAT2 to MAT4 back to the plate electrode PL of MAT1 in an electrical charging operation also increases as well.

Accordingly, by repeatedly carrying out electrical discharging operations and electrical charging operations on MAT1 only, the power consumption can be decreased. The plate-electrode control circuit 70 controls a plurality of charge-transfer switches to be described below to enter turned-on and turned-off states. These charge-transfer switches are provided between the plate electrode PL of MAT1 and the plate electrodes PL of MAT2 to MAT4 to serve as switches through which electric charge is transferred between the plate electrode PL of MAT1 and the plate electrodes PL of MAT2 to MAT4 in the electrical discharging operations and the electrical charging operations.

As described above, the plate-electrode control circuit 70 controls the charge-transfer switches provided between the plate electrodes PL of MAT1 to MAT4 so as to transfer electric charge accumulated in the plate electrode PL of MAT1 to the plate electrodes PL of MAT2, MAT3 and MAT4 in the three electrical discharging operations carried out at the times t1, t2 and t3 respectively in the following predetermined order: t1→t2→t3. Later on, the plate-electrode control circuit 70 controls the charge-transfer switches provided between the plate electrodes PL of MAT1 to MAT4 so as to transfer electric charge accumulated in the plate electrodes PL of MAT4, MAT3 and MAT2 to the plate electrode PL of MAT1 in the three electrical charging operations carried out at the times t4, t5 and t6 respectively in the following predetermined order: t4→t5→t6. Thus, the order of t4→t5→t6 is opposite to the order of t1→t2→t3. In this way, by transferring electric charge accumulated in the plate electrodes PL of MAT4, MAT3 and MAT2 back to the plate electrode PL of MAT1 in an order opposite to the order in which electric charge accumulated in the plate electrode PL of MAT1 has been transferred before to the plate electrodes PL of MAT2, MAT3 and MAT4, the electric charge accumulated in the plate electrodes PL of MAT4, MAT3 and MAT2 can be transferred back to the plate electrode PL of MAT1 with a high degree of efficiency.

FIG. 4 is an explanatory block diagram referred to in the following description of the configuration of the switch circuit 50 which employs a plurality of power-supply switches VSw each used for connecting one of MAT1 to MAT4 to the power-supply section 60 for generating the power-supply voltage VDD, a plurality of ground switches GSw each used for connecting one of MAT1 to MAT4 to the ground node set at the ground voltage GND and a plurality of charge-transfer switches Swi where i=1 to 6. Each of the charge-transfer switches Swi is used for connecting the plate electrode PL of a memory mat 20 to the plate electrodes PL of the other memory mats 20. As described above, the nonvolatile storage device 10 employs four memory mats 20, i.e., MAT1 to MAT4. To be more specific, the charge-transfer switch Sw1 is provided between the plate electrodes PL of MAT1 and MAT2 to serve as a switch for allowing electric charge to be transferred between these plate electrodes PL. By the same token, the charge-transfer switch Sw2 is provided between the plate electrodes PL of MAT1 and MAT3 to serve as a switch for allowing electric charge to be transferred between these plate electrodes PL. In the same way, the charge-transfer switch Sw3 is provided between the plate electrodes PL of MAT1 and MAT4 to serve as a switch for allowing electric charge to be transferred between these plate electrodes PL. Likewise, the charge-transfer switch Sw4 is provided between the plate electrodes PL of MAT2 and MAT3 to serve as a switch for allowing electric charge to be transferred between these plate electrodes PL. Similarly, the charge-transfer switch Sw5 is provided between the plate electrodes PL of MAT2 and MAT4 to serve as a switch for allowing electric charge to be transferred between these plate electrodes PL. By the same token, the charge-transfer switch Sw6 is provided between the plate electrodes PL of MAT3 and MAT4 to serve as a switch for allowing electric charge to be transferred between these plate electrodes PL.

That is to say, the switch circuit 50 has the six charge-transfer switches Sw1 to Sw6 each used for connecting two of the four plate electrodes PL of MAT1 to MAT4 to each other. By putting any specific one of the six charge-transfer switches Sw1 to Sw6 in a turned-on state, two plate electrodes PL of two of MAT1 to MAT4 are connected to each other by the specific charge-transfer switches Sw and electric charge is transferred between the two connected plate electrodes PL. As described above, each of the power-supply switches VSw is used for connecting one of MAT1 to MAT4 to the power-supply section 60 for generating the power-supply voltage VDD whereas each of the ground switches GSw is used for connecting one of MAT1 to MAT4 to the ground node set at the ground voltage GND.

By referring to FIG. 5, the following description further explains details of the electrical charging and discharging operations which are carried out to transfer electric charge between the plate electrode PL of MAT1 and the plate electrodes PL of MAT2 to MAT4. In the typical electrical charging and discharging operations shown in FIG. 5, in the initial state, each of voltages appearing on the plate electrodes PL of MAT1, MAT2, MAT3 and MAT4 is set at 0 V in the initial state. In addition, in the typical electrical charging and discharging operations to be enlightened below by referring to FIG. 5, the basic set operation described earlier and the basic verify operation following the basic set operation as explained before are carried out on MAT1 repeatedly a plurality of times.

A set operation carried out on MAT1 is an operation to set a voltage appearing on the plate electrode PL of MAT1 at 3.2 V. That is to say, a first set operation is carried out on MAT1 in order to set the voltage appearing on the plate electrode PL of MAT1 at 3.2 V. In the following description, the voltage appearing on the plate electrode PL of MAT1 is referred to as a voltage Vp1. Then, in order to carry out a verify operation after the first set operation, it is necessary to lower the voltage Vp1 from 3.2 V to the ground voltage GND of 0 V. However, the voltage Vp1 is not lowered right away from 3.2 V to the ground voltage GND of 0 V. Instead, the voltage Vp1 is lowered as follows. A sequence of three electrical discharging operations is carried out in order to transfer electric charge accumulated in the plate electrode PL of MAT1 to the plate electrodes PL of MAT2 to MAT4 respectively and to save the electric charge in the plate electrodes PL of MAT2 to MAT4. Then, the plate electrode PL of MAT1 is connected to the ground node set at the ground voltage GND of 0 V at which the verify operation is carried out. After the verify operation has been completed, a sequence of three electrical charging operations is carried out in order to transfer electric charge accumulated in the plate electrodes PL of MAT2 to MAT4 respectively to the plate electrode PL of MAT1. In this way, as electric charge to be utilized in the next set operation, it is possible to reutilize the electric charge transferred from the plate electrode PL of MAT1 to the plate electrodes PL of MAT2 to MAT4 in the electrical discharging operations and then transferred from the plate electrodes PL of MAT2 to MAT4 back to the plate electrode PL of MAT1 in the electrical charging operations.

In the following description, voltages appearing on the plate electrodes PL of MAT2, MAT3 and MAT4 are referred to as voltages Vp2, Vp3 and Vp4 respectively. The plate-electrode control circuit 70 controls operations to turn on and off the charge-transfer switches Sw1 to Sw6 each provided between two of the plate electrodes PL, the ground switches GSw each provided between the ground node set at the ground voltage GND and one of the plate electrodes PL and the power-supply switches VSw each provided between the power-supply node of the power-supply section 60 and one of the plate electrodes PL. As described earlier, the charge-transfer switches Sw1 to Sw6 are switches through which electric charge is transferred between two of the plate electrodes PL in the electrical discharging operations and the electrical charging operations.

First Sequence of Three Electrical Discharging Operations

In a typical nonvolatile storage device 10 employing four memory mats 20, that is, MAT1 to MAT4, three electrical discharging operations to transfer electric charge from the plate electrode PL of MAT1 to the plate electrodes PL of MAT2, MAT3 and MAT4 are carried out as a sequence of three electrical discharging operations in the following order of three steps, i.e., Step 1 (that is, MAT1→MAT2), Step 2 (that is, MAT1→MAT3) and Step 3 (that is, MAT1→MAT4) respectively.

At Step 1, the charge-transfer switch Sw1 is put in a turned-on state in order to allow electric charge accumulated in the plate electrode PL of MAT1 to enter the state of an equilibrium with electric charge accumulated in the plate electrode PL of MAT2, putting each of the voltage Vp1 and the voltage Vp2 in a settled state within a predetermined time period T1 before the charge-transfer switch Sw1 is put back in a turned-off state. In the state of an equilibrium between the plate electrode PL of MAT1 and the plate electrode PL of MAT2, the voltage Vp1 becomes equal to the voltage Vp2 due to a transfer of a voltage difference of 1.60 V from the voltage Vp1 to the voltage Vp2 at Step S1. That is to say, at the end of the time period T1, the voltages appearing on the plate electrodes PL of MAT1 to MAT4 are found by calculation approximately as follows: Vp1=1.60 V, Vp2=1.60 V, Vp3=0.00 V and Vp4=0.00 V respectively.

At Step 2, the charge-transfer switch Sw2 is put in a turned-on state in order to allow electric charge accumulated in the plate electrode PL of MAT1 to enter the state of an equilibrium with electric charge accumulated in the plate electrode PL of MAT3, putting each of the voltage Vp1 and the voltage Vp3 in a settled state within a predetermined time period T2 before the charge-transfer switch Sw2 is put back in a turned-off state. In the state of an equilibrium between the plate electrode PL of MAT1 and the plate electrode PL of MAT3, the voltage Vp1 becomes equal to the voltage Vp3 due to a transfer of a voltage difference of 0.80 V from the voltage Vp1 to the voltage Vp3 at Step S2. That is to say, at the end of the time period T2, the voltages appearing on the plate electrodes PL of MAT1 to MAT4 are found by calculation approximately as follows: Vp1=0.80 V, Vp2=1.60 V, Vp3=0.80 V and Vp4=0.00 V respectively.

At Step 3, the charge-transfer switch Sw3 is put in a turned-on state in order to allow electric charge accumulated in the plate electrode PL of MAT1 to enter the state of an equilibrium with electric charge accumulated in the plate electrode PL of MAT4, putting each of the voltage Vp1 and the voltage Vp4 in a settled state within a predetermined time period T3 before the charge-transfer switch Sw3 is put back in a turned-off state. In the state of an equilibrium between the plate electrode PL of MAT1 and the plate electrode PL of MAT4, the voltage Vp1 becomes equal to the voltage Vp4 due to a transfer of a voltage difference of 0.40 V from the voltage Vp1 to the voltage Vp4 at Step S3. That is to say, at the end of the time period T3, the voltages appearing on the plate electrodes PL of MAT1 to MAT4 are found by calculation approximately as follows: Vp1=0.40 V, Vp2=1.60 V, Vp3=0.80 V and Vp4=0.40 V respectively.

After the electrical discharging operations carried out at Step 1, Step 2 and Step 3 have been completed, the ground switch GSw provided between the plate electrode PL of MAT1 and the ground node is put in a turned-on state in order to carry out an electrical discharging operation to transfer electric charge left in the plate electrode PL of MAT1 to the ground node so as to set the voltage appearing on the plate electrode PL of MAT1 at the ground voltage GND of 0 V (that is, Vp1=0 V). In comparison with a configuration in which the electrical discharging operations are not carried out at Step 1, Step 2 and Step 3, the magnitude of a current flowing from the plate electrode PL of MAT1 to the ground node in the electrical discharging operation to transfer electric charge left in the plate electrode PL of MAT1 to the ground node is small. Thus, ground bounces are suppressed. If the number of ground bounces generated in the configuration carrying out no electrical discharging operations at Step 1, Step 2 and Step 3 are tolerated, power-supply wires made thick to suppress the ground bounces can be made fine.

First Sequence of Three Electrical Charging Operations

After the verify operation following the first sequence of three electrical discharging operations has been completed, prior to the next set operation, a first sequence of three electrical charging operations is carried out in order to set the voltage appearing on the plate electrode PL of MAT1 at 3.2 V which is required by the next set operation. Prior to the next set operation, the first sequence of three electrical charging operations is carried out by reutilizing electric charge accumulated in the plate electrodes PL of MAT2 to MAT4. That is to say, the three electrical charging operations are carried out by transferring the electric charge accumulated in the plate electrodes PL of MAT2 to MAT4 respectively back to the plate electrode PL of MAT1. As a result of the execution of the first sequence of three electrical discharging operations described above, the voltages appearing on the plate electrodes PL of MAT1 to MAT4 prior to the next set operation are given approximately as follows: Vp1=0.00 V, Vp2=1.60 V, Vp3=0.80 V and Vp4=0.40 V respectively. The first sequence of three electrical charging operations to transfer electric charge from the plate electrodes PL of MAT2, MAT3 and MAT4 respectively to the plate electrode PL of MAT1 is carried out in the following order of three steps, i.e., Step 4 (that is, MAT4→MAT1), Step 5 (that is, MAT3→MAT1) and Step 6 (that is, MAT2→MAT1) respectively. Thus, the order of Step 4, Step 5 and Step 6 is an order opposite to the order of Step 1, Step 2 and Step 3 which have been described earlier.

At Step 4, the charge-transfer switch Sw3 is put in a turned-on state in order to allow electric charge accumulated in the plate electrode PL of MAT4 to enter the state of an equilibrium with electric charge accumulated in the plate electrode PL of MAT1, putting each of the voltage Vp1 and the voltage Vp4 in a settled state within a predetermined time period T4 before the charge-transfer switch Sw3 is put back in a turned-off state. In the state of an equilibrium between the plate electrode PL of MAT4 and the plate electrode PL of MAT1, the voltage Vp1 becomes equal to the voltage Vp4 due to a transfer of a voltage difference of 0.20 V from the voltage Vp4 to the voltage Vp1 at Step S4. As a result, at the end of the time period T4, the voltages appearing on the plate electrodes PL of MAT1 to MAT4 are found by calculation approximately as follows: Vp1=0.20 V, Vp2=1.60 V, Vp3=0.80 V and Vp4=0.20 V respectively.

At Step 5, the charge-transfer switch Sw2 is put in a turned-on state in order to allow electric charge accumulated in the plate electrode PL of MAT3 to enter the state of an equilibrium with electric charge accumulated in the plate electrode PL of MAT1, putting each of the voltage Vp1 and the voltage Vp3 in a settled state within a predetermined time period T5 before the charge-transfer switch Sw2 is put back in a turned-off state. In the state of an equilibrium between the plate electrode PL of MAT3 and the plate electrode PL of MAT1, the voltage Vp1 becomes equal to the voltage Vp3 due to a transfer of a voltage difference of 0.30 V from the voltage Vp3 to the voltage Vp1 at Step S5. As a result, at the end of the time period T5, the voltages appearing on the plate electrodes PL of MAT1 to MAT4 are found by calculation approximately as follows: Vp1=0.50 V (=0.20 V+0.30 V), Vp2=1.60 V, Vp3=0.50 V and Vp4=0.20 V respectively.

At Step 6, the charge-transfer switch Sw1 is put in a turned-on state in order to allow electric charge accumulated in the plate electrode PL of MAT2 to enter the state of an equilibrium with electric charge accumulated in the plate electrode PL of MAT1, putting each of the voltage Vp1 and the voltage Vp2 in a settled state within a predetermined time period T6 before the charge-transfer switch Sw1 is put back in a turned-off state. In the state of an equilibrium between the plate electrode PL of MAT2 and the plate electrode PL of MAT1, the voltage Vp1 becomes equal to the voltage Vp2 due to a transfer of a voltage difference of 0.55 V from the voltage Vp2 to the voltage Vp1 at Step S6. As a result, at the end of the time period T6, the voltages appearing on the plate electrodes PL of MAT1 to MAT4 are found by calculation approximately as follows: Vp1=1.05 V (=0.20 V+0.30 V+0.55 V), Vp2=1.05 V, Vp3=0.50 V and Vp4=0.20 V respectively.

After the electrical charging operations carried out at Step 4, Step 5 and Step 6 have been completed, the power-supply switch VSw provided between the plate electrode PL of MAT1 and the power-supply section 60 is put in a turned-on state in order to carry out an electrical charging operation of transferring additional electric charge necessary in the next set operation from the power-supply section 60 to the plate electrode PL of MAT1 so as to raise the voltage Vp1 to 3.20 V (that is, Vp1=3.20 V).

If electric charge is transferred from only the power-supply section 60 for supplying the power-supply voltage VDD to the plate electrode PL of MAT1 in an electrical charging operation carried out before the next set operation, the amount of the transferred electric charge is found approximately as follows: dQ=C*3.20=3.20*C where reference notation dQ denotes the amount of the transferred electric charge whereas reference notation C denotes the capacitance of the plate electrode PL of MAT1. In the case of this embodiment, on the other hand, the first sequence of three electrical discharging operations is carried out prior to a verify operation in order to transfer electric charge from the plate electrode PL of MAT1 to the plate electrodes PL of MAT2 to MAT4 so as to temporarily accumulate the electric charge in the plate electrodes PL of MAT2 to MAT4 respectively and, then, the first sequence of three electrical charging operations is carried out prior to the next set operation in order to transfer the electric charge accumulated in the plate electrodes PL of MAT2 to MAT4 respectively back to the plate electrode PL of MAT1 in order to reutilize the electric charge in the next set operation. Thus, in this embodiment, the plate electrode PL of MAT1 can be electrically charged to 1.05 V, that is, the voltage Vp1 can be raised to 1.05 V, at the end of the time period T6. As a result, in the case of this embodiment, the amount of the additional electric charge necessary in the next set operation is found approximately as follows: dQ=C*(3.20−1.05) =2.15*C.

Second Sequence of Three Electrical Discharging Operations

A second sequence of three electrical discharging operations is carried out after the first sequence of three electrical charging operations described above and the next set operation have been completed. Before the second sequence of three electrical discharging operations is started, the voltages appearing on the plate electrodes PL of MAT1 to MAT4 have been set approximately as follows: Vp1=3.20 V, Vp2=1.05 V, Vp3=0.50 V and Vp4=0.20 V respectively. The second sequence of three electrical discharging operations is carried out in the same way as the first sequence of three electrical discharging operations described above. As a result of executing the second sequence of three electrical discharging operations, the voltages appearing on the plate electrodes PL of MAT1 to MAT4 are found by calculation approximately as follows: Vp1=0.76 V, Vp2=2.10 V, Vp3=1.30 V and Vp4=0.76 V respectively.

After the second sequence of three electrical discharging operations has been carried out, the ground switch GSw provided between the plate electrode PL of MAT1 and the ground node is put in a turned-on state in order to carry out an electrical discharging operation to transfer electric charge left in the plate electrode PL of MAT1 to the ground node so as to set a voltage appearing on the plate electrode PL of MAT1 at the ground voltage GND of 0 V (that is, Vp1=0 V). The voltage Vp1 needs to be set at 0 V in order to carry out a verify operation after the second sequence of three electrical discharging operations has been completed.

Second Sequence of Three Electrical Charging Operations

A second sequence of three electrical charging operations is carried out in the same way as the first sequence of three electrical charging operations described above. Before the second sequence of three electrical charging operations is started, the voltages appearing on the plate electrodes PL of MAT1 to MAT4 have been set approximately as follows: Vp1=0.00 V, Vp2=2.10 V, Vp3=1.30 V and Vp4=0.76 V respectively. As a result of executing the second sequence of three electrical charging operations, the voltages appearing on the plate electrodes PL of MAT1 to MAT4 are found by calculation approximately as follows: Vp1=1.49 V, Vp2=1.49 V, Vp3=0.84 V and Vp4=0.38 V respectively.

After the second sequence of three electrical charging operations has been carried out, the power-supply switch VSw provided between the plate electrode PL of MAT1 and the power-supply section 60 is put in a turned-on state in order to carry out an electrical charging operation of transferring additional electric charge necessary in the next set operation from the power-supply section 60 to the plate electrode PL of MAT1 so as to raise the voltage Vp1 to 3.20 V (that is, Vp1=3.20 V). In this case, the amount of additional electric charge necessary in the next set operation is found approximately as follows: dQ=C*(3.20−1.49)=1.71*C.

Nth Sequence of Three Electrical Discharging Operations

As described above, by repeatedly carrying out the sequence of three electrical discharging operations to transfer electrical charge from the plate electrode PL of MAT1 to the plate electrodes PL of MAT2 to MAT4 respectively and the sequence of three electrical charging operations to transfer electrical charge from the plate electrodes PL of MAT2 to MAT4 respectively to the plate electrode PL of MAT1, the amount of electric charge accumulated in each of the plate electrodes PL of MAT2 to MAT4 gradually rises. Thus, the amount of electric charge that can be transferred to the plate electrode PL of MAT1 in an electrical charging operation also increases as well. As a result, the larger the number of times the sequence of three electrical discharging operations are carried out and the larger the number of times the sequence of three electrical charging operations are carried out, the smaller the amount of electric charge transferred from the power-supply section 60 to the plate electrode PL of MAT1 to serve as electric charge required in the next set operation and, therefore, the smaller the power consumption.

Let N be the number of times the sequence of 3 electrical discharging operations is carried out to transfer electrical charge from the plate electrode PL of MAT1 to the plate electrodes PL of MAT2 to MAT4 respectively and the sequence of three electrical charging operations is carried out to transfer electrical charge from the plate electrodes PL of MAT2 to MAT4 respectively to the plate electrode PL of MAT1 in order obtain the maximum reduction of the power consumption. The following description explains the Nth sequence of three electrical discharging operations.

As a result of a set operation which has been carried out after the (N−1)th execution of the sequence of three electrical discharging operations and the (N−1)th execution of the sequence of three electrical charging operations, in accordance with calculation determined in advance, the voltages appearing on the plate electrodes PL of MAT1 to MAT4 can be predicted to have approximately the following values: Vp1=3.20 V, Vp2=1.92 V, Vp3=1.28 V and Vp4=0.64 V respectively. Thus, for Vp1=3.20 V, Vp2=1.92 V, Vp3=1.28 V and Vp4=0.64 V, the Nth sequence of three electrical discharging operations is carried out in order to transfer electrical charge from the plate electrode PL of MAT1 to the plate electrodes PL of MAT2 to MAT4 respectively. As a result of executing the Nth sequence of three electrical discharging operations, the voltages appearing on the plate electrodes PL of MAT1 to MAT4 are set approximately as follows: Vp1=1.28 V, Vp2=2.56 V, Vp3=1.92 V and Vp4=1.28 V respectively. After the Nth sequence of three electrical discharging operations has been carried out, the ground switch GSw provided between the plate electrode PL of MAT1 and the ground node is put in a turned-on state in order to carry out an electrical discharging operation to transfer electric charge left in the plate electrode PL of MAT1 to the ground node so as to set a voltage appearing on the plate electrode PL of MAT1 at the ground voltage GND of 0 V (that is, Vp1=0 V). The voltage Vp1 needs to be set at 0 V in order to carry out a verify operation after the Nth sequence of three electrical discharging operations has been completed.

Nth Sequence of Three Electrical Charging Operations

After the verify operation following the Nth sequence of three electrical discharging operations has been carried out, the voltages appearing on the plate electrodes PL of MAT1 to MAT4 are set approximately as follows: Vp1=0.00 V, Vp2=2.56 V, Vp3=1.92 V and Vp4=1.28 V respectively. After the Nth sequence of three electrical charging operations following the verify operation has been carried out, the voltages appearing on the plate electrodes PL of MAT1 to MAT4 are set approximately as follows: Vp1=1.92 V, Vp2=1.92 V, Vp3=1.28 V and Vp4=0.64 V respectively. After the Nth sequence of three electrical charging operations has been carried out, the power-supply switch VSw provided between the plate electrode PL of MAT1 and the power-supply section 60 is put in a turned-on state in order to carry out an electrical charging operation of transferring additional electric charge necessary in the next set operation from the power-supply section 60 to the plate electrode PL of MAT1 so as to raise the voltage Vp1 to 3.20 V (that is, Vp1=3.20 V). In this case, the amount of additional electric charge necessary in the next set operation is found approximately as follows: dQ=C*(3.20−1.92)=1.28*C. In comparison with a configuration in which electric charge is not reutilized, by reutilizing the electric charge repeatedly a predetermined number of times, the amount of power required to carry out a set operation can be reduced to 40%. That is to say, the power consumption can be decreased by 60%. In the typical example described above, the predetermined number is N.

In addition, the larger the number of memory mats 20 used in reduction of the amount of power required to carry out a set operation, the higher the degree of efficiency with which electric charge is utilized. In the case of a nonvolatile storage device 10 employing four memory mats 20 as described above for example, the power consumption can be decreased by 60%. In the case of a nonvolatile storage device 10 employing eight memory mats 20, on the other hand, the power consumption can be decreased by 78% in accordance with calculation.

As described above, the nonvolatile storage device 10 adopting the plate method reutilizes electric charge accumulated in a plate electrode PL in order to reduce the magnitude of a consumed current. In particular, by increasing the number of memory mats 20 each wired to a plate electrode PL, the effect of the reduction of the power consumption can be enhanced.

An embodiment of the present invention has been explained in detail so far by referring to diagrams. However, the embodiment is no more than a typical implementation of the present invention. In addition, it should be understood by those skilled in the art that a variety of modifications, combinations, sub-combinations and alterations may occur, depending on design requirements and other factors as far as they are within the scope of the appended claims or the equivalents thereof.

The present application contains subject matter related to that disclosed in Japanese Priority Patent Application JP 2010-073368 filed in the Japan Patent Office on Mar. 26, 2010, the entire content of which is hereby incorporated by reference.

What is claimed is:

1. A nonvolatile storage device comprising:
a first plate electrode electrically connected to a first memory mat;
a first charge-transfer switch configurable to provide electrical connection and disconnection between a second plate electrode and said first plate electrode;
a second charge-transfer switch configurable to provide electrical connection and disconnection between said first plate electrode and a third plate electrode;
a third charge-transfer switch configurable to provide electrical connection and disconnection between said first plate electrode and a fourth plate electrode;
a ground node configured to receive a ground voltage;
a ground switch configurable to provide electrical connection and disconnection between said first plate electrode and said ground node;
a power-supply node configured to receive a power-supply voltage;
a power-supply switch configurable to provide electrical connection and disconnection between said first plate electrode and said power-supply node,
wherein said third charge-transfer switch electrically connects said first plate electrode to said fourth plate electrode along with said second charge-transfer switch electrically disconnecting said first plate electrode from said third plate electrode.

2. The nonvolatile storage device according to claim 1, further comprising:
memory cells in the first memory mat, each of the memory cells in the first memory being electrically connected to said first plate electrode.

3. The nonvolatile storage device according to claim 1, further comprising:
memory cells in a second memory mat, each of the memory cells in the second memory being electrically connected to said second plate electrode.

4. The nonvolatile storage device according to claim 1, further comprising:
a source of an access transistor electrically connected to a terminal of a storage element, another terminal of the storage element being electrically connected to said first plate electrode.

5. The nonvolatile storage device according to claim 4, further comprising:
a bit line electrically connected to a drain of the access transistor, a gate of the access transistor being electrically connected to a word line.

6. The nonvolatile storage device according to claim 4, wherein said storage element is a variable-resistance-type storage element.

7. The nonvolatile storage device according to claim 6, wherein said variable-resistance-type storage element has a resistance, said resistance being modifiable.

8. The nonvolatile storage device according to claim 1, wherein said second charge-transfer switch electrically connects said first plate electrode to said third plate electrode along with said first charge-transfer switch electrically disconnecting said first plate electrode from said second plate electrode.

9. The nonvolatile storage device according to claim 1, wherein said first charge-transfer switch electrically connects said first plate electrode to said second plate electrode along with said second charge-transfer switch electrically disconnecting said first plate electrode from said third plate electrode.

10. The nonvolatile storage device according to claim 1, wherein said second charge-transfer switch electrically connects said first plate electrode to said third plate electrode along with said third charge-transfer switch electrically disconnecting said first plate electrode from said fourth plate electrode.

11. The nonvolatile storage device according to claim 1, wherein said first charge-transfer switch electrically connects said first plate electrode to said second plate electrode.

12. The nonvolatile storage device according to claim 1, wherein said first charge-transfer switch electrically disconnects said first plate electrode from said second plate electrode.

\* \* \* \* \*